United States Patent
Zhang et al.

(10) Patent No.: US 10,623,049 B2
(45) Date of Patent: Apr. 14, 2020

(54) DIGITAL PREDISTORTION PROCESSING METHOD AND APPARATUS

(71) Applicant: HUAWEI TECHNOLOGIES CO., LTD., Shenzhen (CN)

(72) Inventors: Lie Zhang, Xi'an (CN); Erni Zhu, Shanghai (CN); Yuxiang Xiao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/424,500

(22) Filed: May 29, 2019

(65) Prior Publication Data

US 2019/0280730 A1    Sep. 12, 2019

Related U.S. Application Data

(63) Continuation of application No. PCT/CN2016/107710, filed on Nov. 29, 2016.

(51) Int. Cl.
*H04B 1/62* (2006.01)
*H04B 1/04* (2006.01)
(Continued)

(52) U.S. Cl.
CPC ............ *H04B 1/62* (2013.01); *H03F 1/3247* (2013.01); *H03F 3/24* (2013.01); *H03F 3/68* (2013.01);
(Continued)

(58) Field of Classification Search
CPC .............................. H04B 1/62; H04B 1/0458; H04B 2001/0425; H04B 2001/0491;
(Continued)

(56) References Cited

U.S. PATENT DOCUMENTS 7,466,760 B2 *  12/2008  Sorrells .................... H03C 5/00
                                                        375/294
2013/0089044 A1   4/2013  Park et al.
(Continued)

FOREIGN PATENT DOCUMENTS

CN          101316250 A       12/2008
CN          102594749 A        7/2012
(Continued)

OTHER PUBLICATIONS

Sangil Lee et al.,"Digital Predistortion for Power Amplifiers in Hybrid MIMO Systems with Antenna Subarrays",2015 IEEE 81st Vehicular Technology Conference (VTC Spring) ,total 5 pages.
(Continued)

*Primary Examiner* — Vineeta S Panwalkar
(74) *Attorney, Agent, or Firm* — Kilpatrick Townsend & Stockton LLP (57) ABSTRACT

This application relates to the field of communications technologies, and in particular, to a digital predistortion processing method and apparatus. This application provides a digital predistortion processing method and apparatus. Digital predistortion processing of a multichannel power amplifier is supported through deprecoding processing by using one feedback link and one digital predistortion processor. In addition, after being amplified by a power amplifier, a precoded signal is fed back to the feedback link for predistortion parameter calculation, to improve quality of a transmit signal. The digital predistortion processing method and apparatus that are provided in embodiments of this application are intended to improve output linearity and efficiency of a multi-transmit-channel power amplifier while reducing implementation costs and complexity of a transmit device, and further improve overall system performance.

16 Claims, 6 Drawing Sheets

(51) Int. Cl.
   *H03F 3/68* (2006.01)
   *H04L 25/03* (2006.01)
   *H03F 1/32* (2006.01)
   *H04B 17/13* (2015.01)
   *H04L 1/24* (2006.01)
   *H03F 3/24* (2006.01)
   *H04B 7/0413* (2017.01)

(52) U.S. Cl.
   CPC ......... *H04B 1/0458* (2013.01); *H04B 1/0475* (2013.01); *H04B 17/13* (2015.01); *H04L 1/243* (2013.01); *H04L 25/03343* (2013.01); *H03F 2200/451* (2013.01); *H04B 7/0413* (2013.01); *H04B 2001/0425* (2013.01); *H04B 2001/0491* (2013.01)

(58) Field of Classification Search
   CPC .... H04B 7/0413; H04B 17/13; H04B 1/0475; H03F 3/68; H03F 1/3247; H03F 3/24; H03F 2200/451; H04L 25/03343; H04L 1/243
   See application file for complete search history.

(56) References Cited

U.S. PATENT DOCUMENTS

| | | |
|---|---|---|
| 2014/0029952 A1 | 1/2014 | Liu et al. |
| 2014/0226511 A1 | 8/2014 | Gotman et al. |
| 2015/0103952 A1 | 4/2015 | Wang et al. |
| 2015/0146805 A1 | 5/2015 | Terry et al. |
| 2018/0054225 A1* | 2/2018 | Ghannouchi ......... H03F 1/3247 |

FOREIGN PATENT DOCUMENTS

| | | |
|---|---|---|
| CN | 102684819 A | 9/2012 |
| CN | 103975633 A | 8/2014 |
| CN | 105075164 A | 11/2015 |
| EP | 2822242 A1 | 1/2015 |
| EP | 2882154 A1 | 6/2015 |
| WO | 2014053921 A1 | 4/2014 |

OTHER PUBLICATIONS

Sungho Choi et al. Digital Predistortion Based on Combined Feedback in MIMO Transmitters, IEEE Communications Letters ( vol. 16 , Issue: 10 , Oct. 2012 ), pp. 1572-1575. XP011469233.

* cited by examiner

DIGITAL PREDISTORTION PROCESSING METHOD AND APPARATUS

CROSS-REFERENCE TO RELATED APPLICATIONS

This application is a continuation of International Application No. PCT/CN2016/107710, filed on Nov. 29, 2016, the disclosure of which is hereby incorporated by reference in its entirety.

TECHNICAL FIELD

This application relates to the field of communications technologies, and in particular, to a digital predistortion processing method and apparatus.

BACKGROUND

In a wireless signal transmit device, one key factor that affects communication quality is transmit signal distortion that is generated because a power amplifier (PA, Power Amplifier) operates in a non-linear area of the power amplifier. Currently, a digital predistortion (Digital Predistortion, DPD) technology is a common method for resolving a problem of PA distortion. The method can improve PA efficiency by reducing distortion generated when the PA runs in the non-linear area of the PA.

In a massive multiple-input multiple-output technology (Massive multiple-input multiple-output, Massive MIMO) application scenario, a quantity of transmit channels of a transmit device increases, and a digital predistortion processor and a feedback link need to be disposed for each transmit channel if a conventional digital predistortion apparatus is still used. Consequently, costs and link complexity of the transmit device are increased dramatically. In a current multichannel digital predistortion processing solution, digital predistortion training and processing need to be performed on a plurality of channels by turns if quantities of digital predistortion processors and feedback links are decreased. A larger quantity of channels results in lower digital predistortion processing efficiency. Consequently, a calibration implementation requirement cannot be met, and system performance is affected.

Therefore, a multi-transmit-channel digital predistortion calibration method and apparatus are required, to reduce implementation costs and complexity of the transmit device, ensure output linearity and efficiency of a multichannel power amplifier, and improve the system performance.

SUMMARY

This specification describes a digital predistortion processing method and apparatus, so that a plurality of transmit channels share one feedback link and one digital predistortion processor by performing deprecoding processing in the feedback link. In this way, output linearity and efficiency of a multi-transmit-channel power amplifier are improved while implementation costs and complexity of a transmit device are reduced, and overall system performance is further improved.

According to a first aspect, an embodiment of this application provides a digital predistortion processing apparatus, including a digital predistortion processor, a precoding and baseband signal conversion part, a feedback signal conversion part, a deprecoder, and a predistortion parameter calculation part. The digital predistortion processor is configured to: receive a first baseband signal, perform digital predistortion processing on the first baseband signal based on a predistortion parameter to obtain a second baseband signal, and send the second baseband signal to the precoding and baseband signal conversion part. The precoding and baseband signal conversion part is configured to: perform precoding and baseband signal conversion on the second baseband signal to obtain N channels of precoded radio frequency signals, and separately send the N channels of precoded radio frequency signals to power amplifiers, where $N \geq 1$. The feedback signal conversion part is configured to: couple N channels of radio frequency signals amplified by the power amplifiers to a feedback link, convert N channels of radio frequency signals in the feedback link into N channels of third baseband signals, and send the N channels of third baseband signals to the deprecoder. The deprecoder is configured to: deprecode the N channels of third baseband signals to obtain a fourth baseband signal, and send the fourth baseband signal to the predistortion parameter calculation part. The predistortion parameter calculation part is configured to: calculate a predistortion parameter based on the first baseband signal and the fourth baseband signal, and send the predistortion parameter obtained through calculation to the digital predistortion processor. Optionally, the first baseband signal may be a service signal, or may be a signal dedicatedly used for digital predistortion processing. The predistortion parameter obtained through calculation by using the dedicated signal may also be applied to a process of performing digital predistortion processing on the service signal. N channels of signals may be converted into one channel of signal by performing deprecoding processing in the feedback link. In this way, multichannel predistortion processing can be supported by using one feedback link and one predistortion processor. In addition, the N channels of amplified radio frequency signals coupled to the feedback link are precoded, include information such as distortion of a power amplifier of each transmit channel, and are similar to a signal received at a wireless signal receive end (for example, user equipment); and the predistortion parameter is calculated by using the signals. In this way, a signal to interference plus noise ratio (Signal to Interference plus Noise Ratio, SINR) of a signal at the receive end can be further increased during the predistortion processing, and overall system performance is further improved.

In a possible design, that the feedback signal conversion part couples the N channels of radio frequency signals amplified by the power amplifiers to the feedback link includes: coupling, to the feedback link, the N channels of radio frequency signals output by the power amplifiers, or coupling, to the feedback link, the N channels of radio frequency signals to be transmitted by antennas. The radio frequency signal output by the power amplifier includes most of signal distortion information generated in a transmit link, and is similar to a true signal received at the receive end; and the radio frequency signal is coupled to the feedback link for predistortion parameter calculation. This is equivalent to performing the predistortion processing on the signal received at the receive end. In other words, the SINR and an out-of-band intermodulation indicator at the receive end are used as a target to obtain the predistortion parameter. In this way, a spectrum leakage suppression effect can be improved, and an error vector magnitude (Error Vector Magnitude, EVM) can be reduced. In other words, the signal to interference plus noise ratio and the out-of-band intermodulation indicator of the signal at the receive end are increased, and the system performance is improved. The radio frequency signal to be transmitted by the antenna is a radio frequency signal that is amplified by the power amplifier and that is sent to the antenna for radiation to space. The signal further includes signal distortion caused during processing of an antenna component, and is more similar to the true signal received at the receive end, and the signal is used to calculate the predistortion parameter. In this way, the signal to interference plus noise ratio of the signal at the receive end can be further increased, and the system performance is improved.

In a possible design, the apparatus further includes a predistortion calibration signal sending part, configured to send the first baseband signal to the digital predistortion processor. Optionally, the first baseband signal may be a periodic signal. Optionally, the predistortion calibration signal sending part may be an independent signal sending apparatus and/or module, or may be integrated with another signal sending apparatus. The predistortion calibration signal sending part is disposed, and may send the first baseband signal based on a specific digital predistortion processing requirement. In this way, impact on a service signal is avoided, and a scenario in which a service signal feature does not meet the digital predistortion processing requirement can also be supported. The predistortion parameter obtained by the digital predistortion processing apparatus through calculation by using the dedicated signal may also be applied to the process of performing digital predistortion processing on the service signal. The digital predistortion processing is performed by using the periodic baseband signal, and the radio frequency signals in the transmit link can be fed back to the feedback link by performing feedback a plurality of times, to calculate the predistortion parameter. In this way, components used for converting the radio frequency signals in the feedback link are reduced, and processing complexity is reduced.

In a possible design, the feedback signal conversion part includes a radio frequency signal converter, configured to convert the radio frequency signal in the feedback link into the third baseband signal. Optionally, the feedback signal conversion part may include N radio frequency signal converters, configured to respectively convert the N channels of radio frequency signals in the feedback link into the N channels of third baseband signals.

In a possible design, the feedback signal conversion part further includes a multichannel selector, configured to: select at least one channel of radio frequency signal from the N channels of radio frequency signals in the feedback link, and send the at least one channel of radio frequency signal to the radio frequency signal converter. Optionally, the feedback signal conversion part may include a multichannel selector and at least one radio frequency signal converter. The multichannel selector selects at least one channel of radio frequency signal from the N channels of radio frequency signals in the feedback link, and sends the at least one channel of radio frequency signal to the at least one radio frequency signal converter. The radio frequency signal converter converts the received radio frequency signal into the third baseband signal. The multichannel selector may support coupling of the N channels of radio frequency signals to the feedback link in a plurality of feedback processes, and the N channels of radio frequency signals are converted into the N channels of third baseband signals through conversion performed a plurality of times. This processing manner may support a plurality of channels of radio frequency signals in sharing a same processing link by time when being coupled to the feedback link and converted into baseband signals, and further reduce hardware costs and implementation complexity of the feedback link. For example, a quantity of radio frequency signal converters can be decreased. Optionally, the same first baseband signal may be periodically sent a plurality of times by cooperating with sending of the periodic baseband signal, same precoding processing is performed on the sent first baseband signal each time, at least one channel of radio frequency signal in the feedback link is converted into a corresponding third baseband signal each time, and the N channels of third baseband signals are obtained after feedback and conversion are performed a plurality of times.

With reference to the foregoing two possible designs, optionally, the radio frequency signal converter includes an analog to digital converter (Analog to Digital Converter, ADC), configured to convert an analog signal into a digital signal, or configured to convert an analog radio frequency signal into a digital baseband signal. Optionally, the radio frequency signal converter may further include a frequency mixer, configured to shift a radio frequency signal to a baseband, to obtain a baseband signal.

In a possible design, the precoding and baseband signal conversion part includes a phase shifter and a baseband signal converter. The phase shifter is configured to: perform amplitude and/or phase adjustment on the second baseband signal based on a precoding matrix to obtain a precoded baseband signal, and send the precoded baseband signal to the baseband signal converter. The baseband signal converter is configured to convert the received precoded baseband signal into the precoded radio frequency signal. Optionally, the precoding and baseband signal conversion part may include N phase shifters and N baseband signal converters. The N phase shifters are configured to: separately perform amplitude and/or phase adjustment on the second baseband signal based on a precoding matrix to obtain N channels of precoded baseband signals, and respectively send the N channels of precoded baseband signals to the N baseband signal converters. The N baseband signal converters are configured to respectively convert the received N channels of precoded baseband signals into the N channels of precoded radio frequency signals.

In a possible design, the precoding and baseband signal conversion part includes a baseband signal converter and a phase shifter. The baseband signal converter is configured to convert the received second baseband signal into a radio frequency signal. The phase shifter is configured to perform amplitude and/or phase adjustment on the radio frequency signal based on a precoding matrix, to obtain the precoded radio frequency signal. Optionally, the precoding and baseband signal conversion part may include N baseband signal converters and N phase shifters. The N baseband signal converters are configured to separately convert the received second baseband signal into N channels of radio frequency signals. The N phase shifters are configured to respectively perform amplitude and/or phase adjustment on the N channels of radio frequency signals based on a precoding matrix, to obtain the N channels of precoded radio frequency signals.

In a possible design, the precoding and baseband signal conversion part includes a baseband signal converter, a power splitter, and a phase shifter. The baseband signal converter is configured to convert the second baseband signal into one channel of radio frequency signal. The power splitter is configured to: divide the channel of radio frequency signal into N channels of radio frequency signals, and send the N channels of radio frequency signals to the phase shifter. The phase shifter is configured to perform amplitude and/or phase adjustment on the radio frequency signals based on a precoding matrix, to obtain the precoded radio frequency signals. Optionally, the precoding and baseband signal conversion part may include one baseband signal converter, one power splitter, and N phase shifters. The baseband signal converter is configured to convert the second baseband signal into one channel of radio frequency signal. The power splitter is configured to: divide the channel of radio frequency signal into N channels of radio frequency signals, and send the N channels of radio frequency signals to the N phase shifters. The N phase shifters are configured to respectively perform amplitude and/or phase adjustment on the N channels of radio frequency signals based on a precoding matrix, to obtain the N channels of precoded radio frequency signals. The second baseband signal is first converted into one channel of radio frequency signal, then the channel of radio frequency signal is divided by the power splitter into N channels of same radio frequency signals, and the N channels of radio frequency signals are precoded. This processing manner may further reduce the hardware costs and the implementation complexity of the processing link. For example, a quantity of baseband signal converters is decreased.

With reference to the foregoing three possible designs, optionally, the baseband signal converter includes a digital-to-analog converter (Digital to Analog Converter, DAC), configured to convert a digital signal into an analog signal, or configured to convert a digital baseband signal into an analog radio frequency signal. Optionally, the baseband signal converter may further include a modulator, configured to modulate a baseband signal to a radio frequency band, to obtain a radio frequency signal.

In a possible design, the precoding and baseband signal conversion part includes a digital-to-analog converter, configured to convert the second baseband signal into the precoded radio frequency signal. Optionally, the precoding and baseband signal conversion part may include N digital-to-analog converters, configured to separately convert the second baseband signal into the N channels of precoded radio frequency signals.

In a possible design, the digital predistortion processing apparatus may further include a power amplifier, configured to: receive the precoded radio frequency signal, amplify the precoded radio frequency signal, and send an amplified precoded radio frequency signal to an antenna. Optionally, the digital predistortion processing apparatus may include N power amplifiers, configured to respectively amplify the N channels of precoded radio frequency signals.

According to a second aspect, an embodiment of this application provides a wireless transceiver apparatus, including the digital predistortion processing apparatus according to any one of the first aspect or the possible designs of the first aspect and an antenna.

According to a third aspect, an embodiment of this application provides a base station, including the wireless transceiver apparatus according to the second aspect.

According to a fourth aspect, this application provides a chip system, configured to implement the digital predistortion processing apparatus according to any one of the first aspect or the possible designs of the first aspect. The chip system may include a chip, or may include a chip and another discrete device. The chip may be an application-specific integrated circuit (Application-Specific Integrated Circuit, ASIC), or may be a chip in another form. Optionally, the chip system may further include a processor, configured to support the digital predistortion processing apparatus in implementing a function described in the foregoing aspect, for example, obtaining a signal and/or a parameter involved in the foregoing aspect, and performing a digital predistortion processing process in the foregoing aspect. In a possible design, the chip system further includes a memory. The memory is configured to store a program instruction and data that are mandatory for the digital predistortion processing apparatus.

According to a fifth aspect, an embodiment of this application provides a digital predistortion processing method, including: performing digital predistortion processing on a first baseband signal based on a predistortion parameter, to obtain a second baseband signal; performing precoding and baseband signal conversion processing on the second baseband signal based on a precoding matrix, to obtain N channels of precoded radio frequency signals, where $N \geq 1$; amplifying the N channels of precoded radio frequency signals by using power amplifiers; coupling N channels of radio frequency signals amplified by the power amplifiers to a feedback link, and converting N channels of radio frequency signals into N channels of third baseband signals; deprecoding the N channels of third baseband signals, to obtain a fourth baseband signal; and calculating a predistortion parameter based on the first baseband signal and the fourth baseband signal. Optionally, the first baseband signal may be a service signal, or may be a signal dedicatedly used for digital predistortion processing.

In a possible design, the coupling N channels of radio frequency signals amplified by the power amplifiers to a feedback link includes: coupling, to the feedback link, the N channels of radio frequency signals output by the power amplifiers; or coupling, to the feedback link, the N channels of radio frequency signals to be transmitted by antennas.

In a possible design, the first baseband signal is a periodic signal. Optionally, the periodic first baseband signal may be a service signal, or may be a signal dedicatedly used for digital predistortion processing.

In a possible design, the coupling N channels of radio frequency signals amplified by the power amplifiers to a feedback link and converting N channels of radio frequency signals into N channels of third baseband signals includes: coupling, by performing radio frequency signal coupling M times and feedback signal conversion M times, the N channels of radio frequency signals amplified by the power amplifiers to the feedback link, and converting the N channels of radio frequency signals into the N channels of third baseband signals, where $1 \leq M \leq N$. Optionally, during the M times of radio frequency signal coupling, the N channels of amplified radio frequency signals are coupled to the feedback link each time; and during the M times of feedback signal conversion, at least one channel of radio frequency signal coupled to the feedback link is selected and converted into a third baseband signal each time. Optionally, during the M times of radio frequency signal coupling, at least one channel of amplified radio frequency signal is coupled to the feedback link each time; and during the M times of feedback signal conversion, at least one channel of radio frequency signal coupled to the feedback link is converted into a third baseband signal each time. The N channels of radio frequency signals may be coupled to the feedback link and converted into the N channels of third baseband signals in one feedback process. In this processing manner, a processing delay is small, digital predistortion processing may be completed more quickly each time, and digital predistortion processing performance is further improved. Alternatively, the N channels of radio frequency signals may be coupled to the feedback link in at least two feedback processes and converted into the N channels of third baseband signals. This processing manner may support a plurality of channels of radio frequency signals in sharing a same processing link by time when being coupled to the feedback link and converted into baseband signals, and further reduce hardware costs and implementation complexity of the feedback link. Optionally, the same first baseband signal may be periodically sent M times by cooperating with sending of the periodic baseband signal, same precoding processing is performed on the sent first baseband signal each time, at least one channel of radio frequency signal in the feedback link is converted into a corresponding third baseband signal each time, and the N channels of third baseband signals are obtained after feedback and conversion are performed M times.

In a possible design, the performing precoding and baseband signal conversion processing on the second baseband signal based on a precoding matrix includes: performing amplitude and/or phase adjustment on the second baseband signal, to obtain N channels of precoded baseband signals; and converting the N channels of precoded baseband signals into the N channels of precoded radio frequency signals.

In a possible design, the performing precoding and baseband signal conversion processing on the second baseband signal based on a precoding matrix includes: converting the second baseband signal into N channels of radio frequency signals; and performing amplitude and/or phase adjustment on the N channels of radio frequency signals based on the precoding matrix, to obtain the N channels of precoded radio frequency signals. Optionally, the second baseband signal may be separately converted into N channels of radio frequency signals, and then amplitude and/or phase adjustment, namely, precoding processing, are/is performed on the N channels of radio frequency signals based on the precoding matrix. Alternatively, the second baseband signal may be converted into one channel of radio frequency signal, then the channel of radio frequency signal is divided into N channels of same radio frequency signals, and the N channels of radio frequency signals are precoded. This processing manner may further reduce the hardware costs and the implementation complexity of the processing link.

According to a sixth aspect, an embodiment of this application provides a digital predistortion processing apparatus. The digital predistortion processing apparatus has a function of implementing any method in the fifth aspect. The function may be implemented by using hardware, or may be implemented by hardware by executing corresponding software. The hardware or the software includes one or more modules corresponding to the foregoing function.

According to a seventh aspect, an embodiment of this application provides a computer storage medium, configured to store a computer software instruction used by the foregoing digital predistortion processing apparatus. The computer software instruction includes a program designed for performing the foregoing aspects.

In comparison with the prior art, according to the digital predistortion processing method and apparatus that are provided in the embodiments of this application, predistortion processing of a multichannel PA may be supported through deprecoding processing by using one feedback link and one digital predistortion processor; and after being precoded and amplified by a PA, a feedback signal in the feedback link is more similar to the signal received at the receive end, and the signal is used to calculate the predistortion parameter and applied to the digital predistortion processing. In this way, the spectrum leakage suppression effect of the transmit signal can be further improved, and the EVM can be reduced. In other words, the SINR of the signal received at the receive end is increased. In addition, optionally, the multichannel PA may further share the feedback link by time by using the periodic dedicated baseband signal. This further reduces implementation and processing complexity of the feedback link. In conclusion, according to the digital predistortion processing method and apparatus that are provided in the embodiments of this application, the implementation costs and complexity of the transmit device are reduced, the output linearity and the efficiency of the multi-transmit-channel power amplifier are improved, and the overall system performance is further improved.

BRIEF DESCRIPTION OF DRAWINGS

The following describes the embodiments of this application with reference to accompanying drawings.

DESCRIPTION OF EMBODIMENTS

The following describes the embodiments of this application with reference to accompanying drawings.

The embodiments of this application may be applied to a Long Term Evolution (Long Term Evolution, LTE) system and a subsequent evolved system, for example, a 5G (5th Generation Mobile Communication, 5th generation mobile communication) system, may be applied to a wireless communications system such as a Universal Mobile Telecommunications System (Universal Mobile Telecommunications System, UMTS) and a global system for mobile communications (Global System for Mobile Communications, GSM), or may be applied to another communications system for which digital predistortion processing needs to be implemented. A network device that applies a solution and/or an apparatus provided in the embodiments of this application is usually a base station in a wireless communications system, or may be another device or apparatus for which digital predistortion processing needs to be implemented. The base station in this application may include a macro base station, a micro base station, a relay station, an access point, a remote radio unit (Remote Radio Unit, RRU), or the like in various forms. In different systems, a device having a function of a base station may have a different name. For example, in an LTE network, the device is referred to as an evolved NodeB (evolved NodeB, eNB or eNodeB); and in a 3G (3rd Generation, 3rd generation) network, the device is referred to as a NodeB (NodeB).

Figure 1:
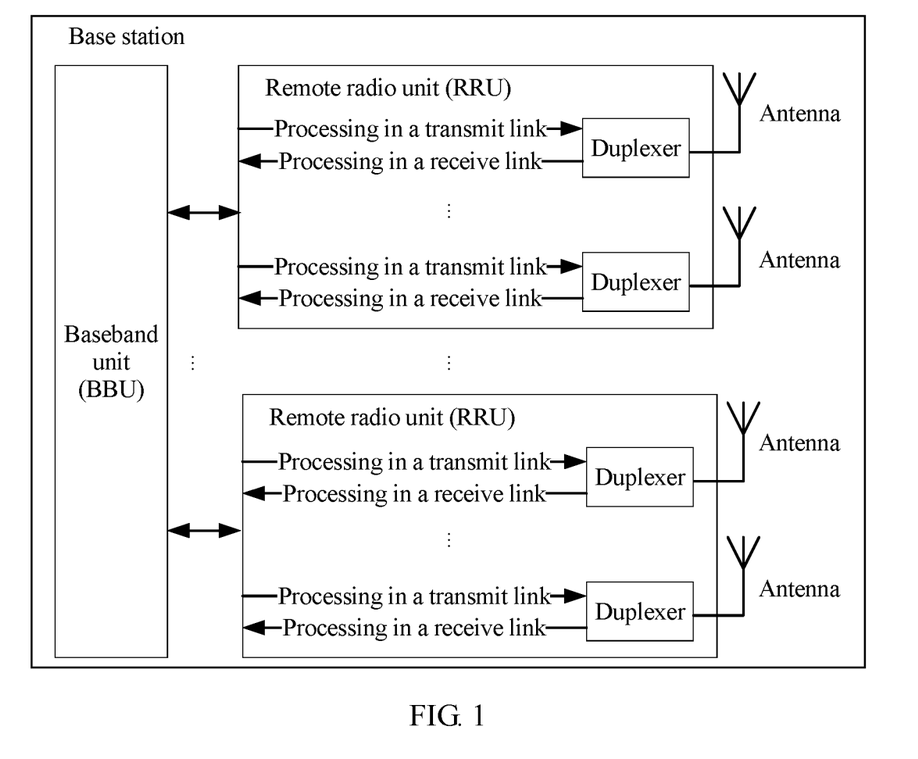
FIG. 1 is a schematic structural diagram of a base station that applies an embodiment of this application.

FIG. 1 is a schematic structural diagram of a base station that may apply an embodiment of this application. The base station includes a baseband unit (BaseBand Unit, BBU), at least one RRU connected to the BBU, and an antenna connected to the RRU. Each RRU may include at least one transmit link and at least one receive link. In a transmit link, a baseband signal processed by the BBU is transmitted to the RRU through an interface between the BBU and the RRU; after the baseband signal is processed in the transmit link of the RRU, a radio frequency signal is obtained; and the radio frequency signal is transmitted by the antenna. In a receive link, a wireless signal received by the antenna is processed in the receive link of the RRU and converted into a baseband signal; the baseband signal is transmitted to the BBU through the interface between the BBU and the RRU; and baseband signal is processed in the BBU. In the transmit link, signal processing performed by the BBU includes precoding, modulation, and the like, and signal processing performed by the RRU includes clipping processing, digital predistortion processing, precoding, up-conversion, amplification, and the like. In the receive link, signal processing performed by the RRU includes low noise amplification processing, down-conversion, and the like, and signal processing performed by the BBU includes equalization, demodulation, decoding, and the like. A specific signal processing algorithm and a specific signal processing sequence of the BBU and/or the RRU are not limited in this application. Optionally, the base station may further have another composition form. For example, the base station includes a BBU and a radio unit (Radio Unit, RU) or includes a BBU and a radio frequency unit (Radio Frequency Unit, RFU). This is not limited in this application.

In an example, a digital predistortion processing method and/or apparatus provided in the embodiments of this application may be applied to processing in the transmit link of the RRU.

Figure 2:
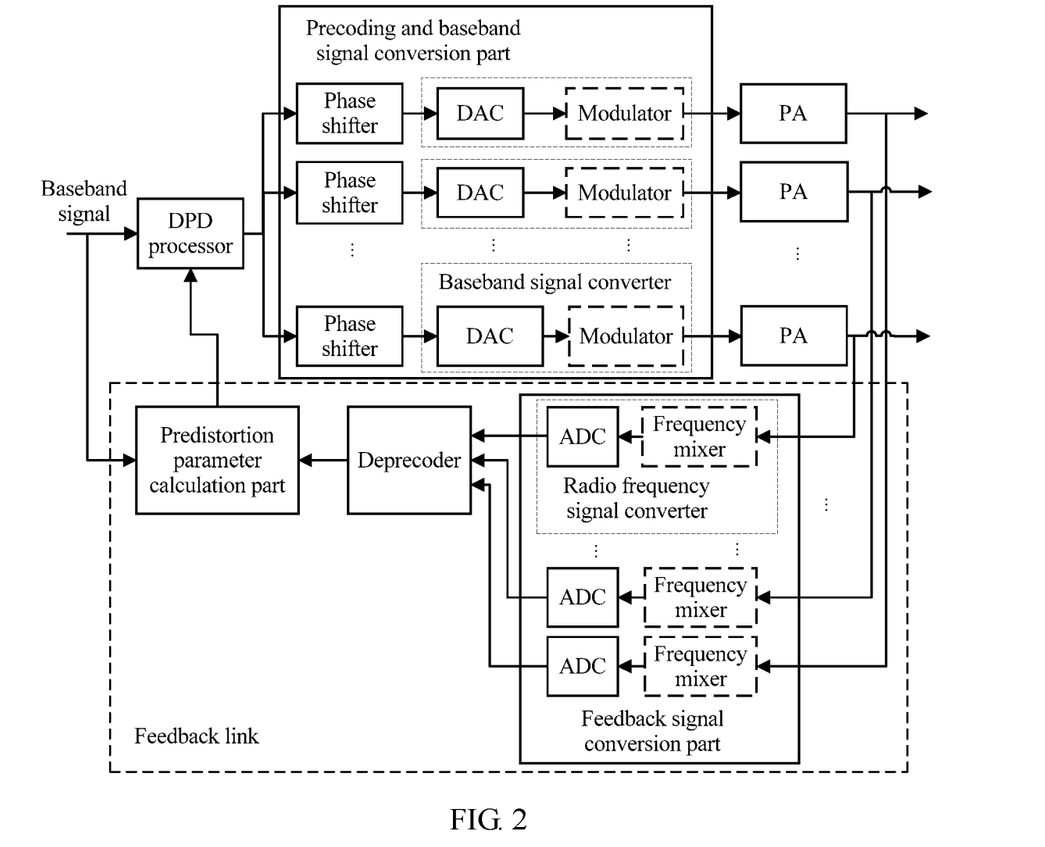
FIG. 2 is a schematic structural diagram of a digital predistortion processing apparatus according to an embodiment of this application.

FIG. 2 is a schematic structural diagram of a digital predistortion processing apparatus according to an embodiment of this application. The digital predistortion processing apparatus includes a digital predistortion (DPD) processor, a precoding and baseband signal conversion part, a feedback signal conversion part, a deprecoder, and a predistortion parameter calculation part. It should be noted that, to illustrate a signal flow and a signal processing process of the digital predistortion processing apparatus, FIG. 2 to FIG. 5 further show a power amplifier (PA) or a PA and an antenna. Optionally, the digital predistortion processing apparatus in this embodiment of this application may further include a PA.

The DPD processor receives one channel of digital baseband signal. The baseband signal may be a service signal such as an OFDM signal that carries service data, or a signal dedicatedly used for DPD processing. The dedicated signal may also be an OFDM signal. The DPD processor performs predistortion processing on the baseband signal by using a currently stored predistortion parameter, and sends a processed baseband signal to the precoding and baseband signal conversion part. The precoding and baseband signal conversion part performs precoding and baseband signal conversion processing on the baseband signal that undergoes the DPD processing, to obtain N channels of precoded analog radio frequency signals, and sends the N channels of precoded analog radio frequency signals to PAs for amplification. N channels of radio frequency signals amplified by the PAs are sent to antennas for transmission. Optionally, if the baseband signal is a signal dedicatedly used for DPD processing, the N channels of radio frequency signals amplified by the PAs may not be sent to a receive end. The N channels of radio frequency signals amplified by the PAs are further fed back to a feedback link. The feedback link in this embodiment of this application is shown in a broken line box in FIG. 2, and is a link including the feedback signal conversion part, the deprecoder, the predistortion parameter calculation part, and a signal transmission path between the three parts. The feedback signal conversion part converts the radio frequency signals amplified by the PAs into N channels of digital baseband signals in the feedback link, and then sends the N channels of digital baseband signals to the deprecoder. The deprecoder deprecodes the N channels of digital baseband signals in the feedback link by using a precoding matrix the same as that used by the precoding and baseband signal conversion part, to obtain one channel of baseband signal, and sends the channel of baseband signal to the predistortion parameter calculation part. The predistortion parameter calculation part calculates a predistortion parameter based on the baseband signal in the feedback link and a baseband signal that undergoes no DPD processing, and then sends the predistortion parameter to the DPD processor for updating, so that the DPD processor uses the new predistortion parameter to perform next predistortion processing.

Optionally, the predistortion processing apparatus may further include a coupler, for example, a directional coupler, configured to couple the N channels of amplified radio frequency signals to the feedback link.

Optionally, the precoding and baseband signal conversion part in the DPD processing apparatus shown in FIG. 2 may be implemented in a plurality of manners.

In an example, as shown in FIG. 2, the precoding and baseband signal conversion part includes N phase shifters and N baseband signal converters. Digital baseband signals that undergo the DPD processing are respectively sent to the N phase shifters. The N phase shifters respectively perform amplitude and/or phase adjustment on the digital signals based on the precoding matrix, to complete precoding. N channels of precoded digital baseband signals are respectively sent to the N baseband signal converters for digital-to-analog conversion and radio frequency shift, so that the N channels of precoded digital baseband signals are converted into N channels of precoded radio frequency signals. Optionally, in this example, the phase shifter is a digital phase shifter.

The baseband signal converter may include a digital-to-analog converter (DAC), configured to perform digital-to-analog conversion. Optionally, the N channels of precoded digital baseband signals are respectively sent to N DACs. Before performing digital-to-analog conversion, the DACs may perform radio frequency shift on the digital baseband signals by using numerically controlled oscillators (Numerically Controlled Oscillator, NCO) included in the DACs, and then perform the digital-to-analog conversion. To be specific, the DACs convert the N channels of precoded digital baseband signals into the N channels of precoded radio frequency signals.

Optionally, the baseband signal converters may further include N modulators. The modulators are configured to perform radio frequency shift on an analog signal in a modulation manner. When the baseband signal converter includes the modulator, the DAC is only configured to perform the digital-to-analog conversion. The N channels of precoded digital baseband signals are respectively sent to the N DACs, and then sent to the modulators after the DACs perform the digital-to-analog conversion. The modulators modulate received analog signals to radio frequency signals, to be specific, to obtain the N channels of precoded radio frequency signals.

Figure 6:
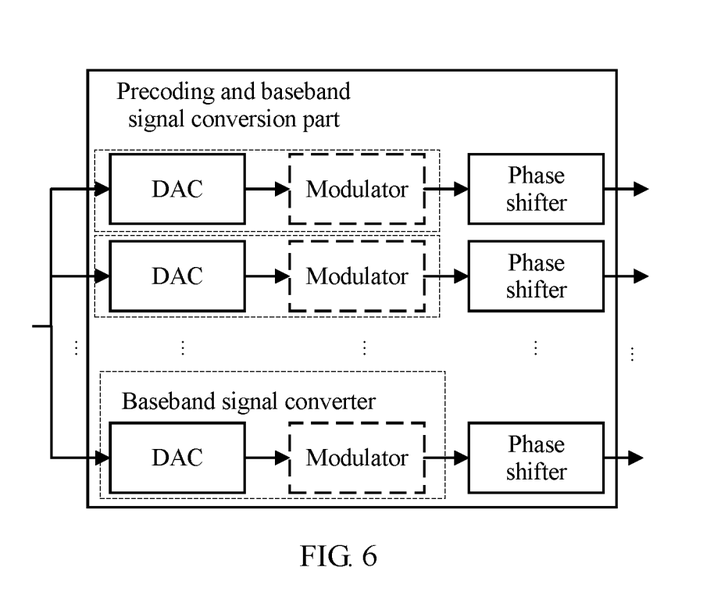
FIG. 6 is a schematic structural diagram of a precoding and baseband signal conversion part according to an embodiment of this application.

In another example, as shown in FIG. 6, the precoding and baseband signal conversion part includes N baseband signal converters and N phase shifters. A difference from the precoding and baseband signal conversion part shown in FIG. 2 is that the baseband signal converter is disposed before the phase shifter. Digital baseband signals that undergo the DPD processing are respectively sent to the N baseband signal converters, so that the digital baseband signals are converted into N channels of analog radio frequency signals. Then, the N channels of analog radio frequency signals are sent to the N phase shifters. The N phase shifters respectively perform amplitude and/or phase adjustment on the N channels of analog radio frequency signals based on the precoding matrix, to obtain N channels of precoded radio frequency signals. Optionally, in this example, the phase shifter is an analog phase shifter. An implementation and a signal processing manner of the baseband signal converter are the same as those in the example corresponding to FIG. 2. Details are not described again.

Figure 7:
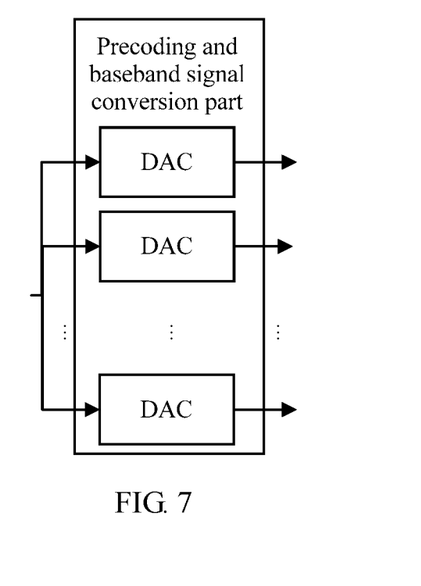
FIG. 7 is a schematic structural diagram of another precoding and baseband signal conversion part according to an embodiment of this application.

In another example, as shown in FIG. 7, the precoding and baseband signal conversion part includes N DACs. The DACs complete precoding, radio frequency shift, and digital-to-analog conversion that are performed on digital baseband signals. Specifically, the baseband signals that undergo the DPD processing are respectively sent to the N DACs. The DACs complete the radio frequency shift and amplitude and/or phase adjustment that are performed on the baseband signals by using NCOs included in the DACs, and then perform the digital-to-analog conversion, to obtain N channels of precoded analog radio frequency signals.

Figure 8:
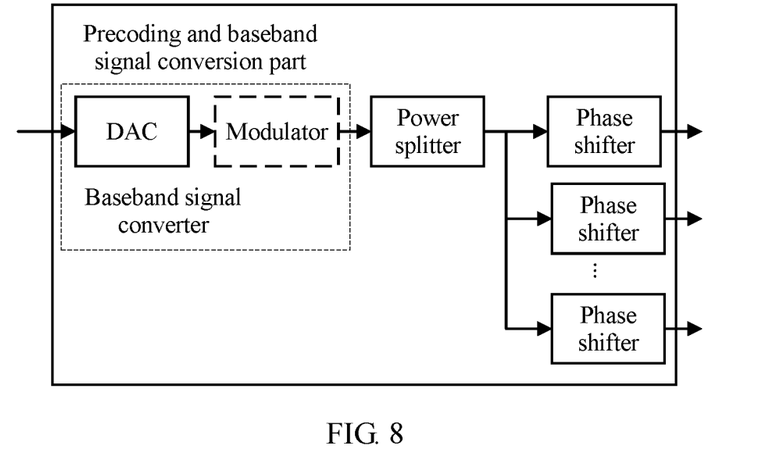
FIG. 8 is a schematic structural diagram of still another precoding and baseband signal conversion part according to an embodiment of this application.

In still another example, as shown in FIG. 8, the precoding and baseband signal conversion part includes one baseband signal converter, a power splitter, and N phase shifters. A baseband signal that undergoes the DPD processing is converted into one channel of analog radio frequency signal by using the baseband signal converter, and then divided into N channels of analog radio frequency signals by using the power splitter. The N phase shifters respectively perform amplitude and/or phase adjustment on the N channels of analog radio frequency signals based on the precoding matrix, to obtain N channels of precoded radio frequency signals. An implementation and a signal processing manner of the baseband signal converter are the same as those in the example corresponding to FIG. 2. Optionally, in this example, the phase shifter is an analog phase shifter.

Optionally, the precoding and baseband signal conversion part shown in each of FIG. 6 to FIG. 8 may replace the precoding and baseband signal conversion part in FIG. 2. Optionally, different implementations of the foregoing precoding and baseband signal conversion parts may be further mixed. For example, the precoding and baseband signal conversion part shown in FIG. 2 is used for one channel of digital baseband signal or several channels of digital baseband signals, and the precoding and baseband signal conversion part shown in FIG. 6 is used for remaining one channel of digital baseband signal or remaining several channels of digital baseband signals.

In a possible implementation, a plurality of channels of signals may further share a baseband signal converter and/or a phase shifter, and certainly, may share a DAC. FIG. 2 is used as an example, the precoding and baseband signal conversion part may include phase shifters whose quantity is less than N and/or baseband signal converters whose quantity is less than N. In this case, in N channels of baseband signals, at least two channels of signals share one phase shifter and/or one baseband signal converter. A specific quantity of included phase shifters, a specific quantity of included baseband signal converters, and a manner for signals to share the foregoing components may be designed based on a specific requirement. This is not limited in this application. Similarly, the precoding and baseband signal conversion parts in FIG. 6 to FIG. 8 may be designed in a similar manner. Details are not described again.

Optionally, the feedback signal conversion part in the DPD processing apparatus shown in FIG. 2 may also be implemented in different manners.

In one example, as shown in FIG. 2, the feedback signal conversion part includes N radio frequency signal converters, configured to convert N channels of radio frequency signals in the feedback link into N channels of digital baseband signals in one DPD processing process, and send the N channels of digital baseband signals to the deprecoder.

The radio frequency signal converter includes an analog to digital converter (ADC), configured to perform analog-to-digital conversion. Optionally, the ADC may further perform down-conversion on a radio frequency signal by using an NCO included in the ADC, and then perform analog-to-digital conversion. In other words, an analog radio frequency signal may be directly converted into a digital baseband signal by using the ADC.

Optionally, the radio frequency signal converter may further include a frequency mixer, configured to perform down-conversion on an analog radio frequency signal. When the radio frequency signal converter includes the frequency mixer, the ADC is only configured to perform the analog-to-digital conversion. The analog radio frequency signal in the feedback link is shifted to a baseband by using the frequency mixer, and then sent to the ADC for the analog-to-digital conversion, to obtain the N channels of digital baseband signals.

Figure 4:
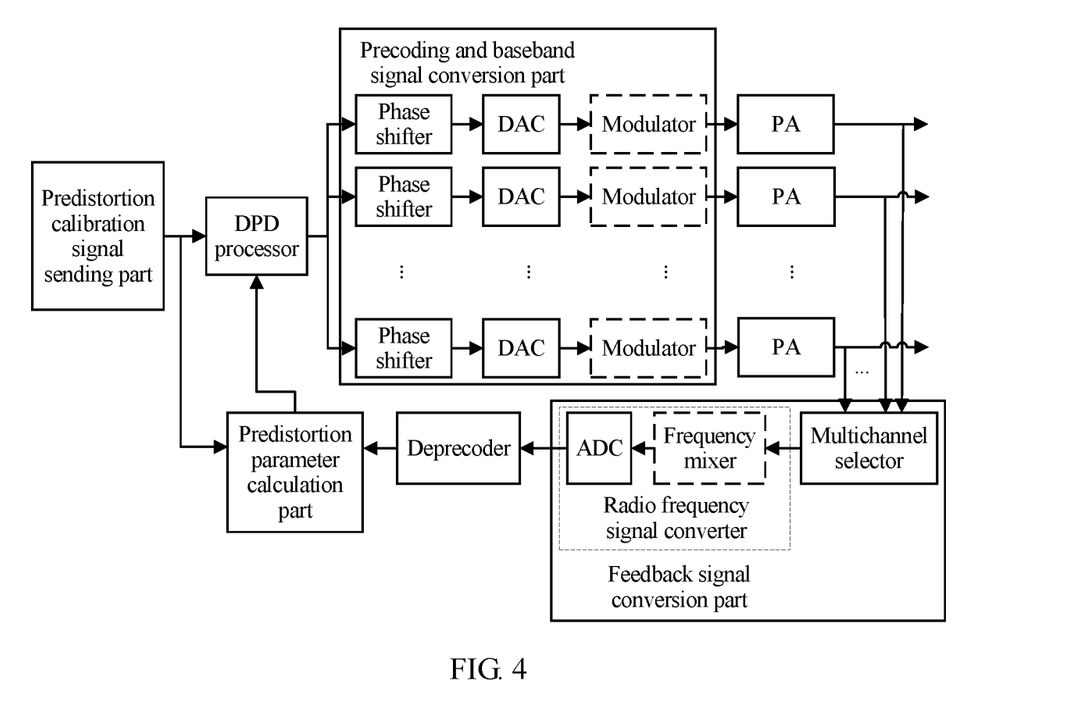
FIG. 4 is a schematic structural diagram of still another digital predistortion processing apparatus according to an embodiment of this application.

In another example, as shown in FIG. 4, the feedback signal conversion part includes one radio frequency signal converter and a multichannel selector. An implementation and signal processing of the radio frequency signal converter are the same as those of the feedback signal conversion part shown in FIG. 2. The multichannel selector is configured to: select one channel of radio frequency signal from N channels of radio frequency signals coupled to the feedback link, and send the channel of radio frequency signal to the radio frequency signal converter for processing. After performing feedback signal conversion N times, the feedback signal conversion part may convert all the N channels of radio frequency signals into baseband signals, and send the baseband signals to the deprecoder. In this example, the DPD processor and the precoding and baseband signal conversion part may perform same processing on the same baseband signal N times, for example, process the baseband signal by using the same predistortion parameter and the same precoding matrix, to ensure that the N channels of amplified radio frequency signals are the same in N processing processes, so that the feedback signal conversion part may process only one channel of radio frequency signal in each processing process, and complete conversion of the N channels of radio frequency signals in the N processing processes. Optionally, the same baseband signal obtained by the DPD processor in the N processing processes may be same service data obtained N times, or may be a periodic signal dedicatedly used for DPD processing.

Optionally, the feedback signal conversion part includes at least two radio frequency signal converters and a multichannel selector. The multichannel selector may select at least one channel of radio frequency signal in each processing process, and send the at least one channel of radio frequency signal to the at least two radio frequency signal converters for processing.

Optionally, selection may be performed in a process of coupling the N channels of amplified radio frequency signals to the feedback link. For example, at least one channel of radio frequency signal is selected and coupled to the feedback link each time, and all the N channels of radio frequency signals are coupled to the feedback link by performing coupling at least two times.

Optionally, the feedback signal conversion part shown in FIG. 4 and the feedback signal conversion part in FIG. 2 may be interchangeable. Optionally, different implementations of the feedback signal conversion part may be further mixed. For example, the feedback signal apparatus shown in FIG. 2 is used for one channel of digital baseband signal or several channels of digital baseband signals, and the feedback signal conversion part shown in FIG. 4 is used for remaining one channel of digital baseband signal or remaining several channels of digital baseband signals. Similar to the precoding and baseband signal conversion part, the feedback signal conversion part may also be a radio frequency signal converter that implements multiplexing of a plurality of channels of signals, to reduce physical components and link complexity. Details are not described herein.

Figure 3:
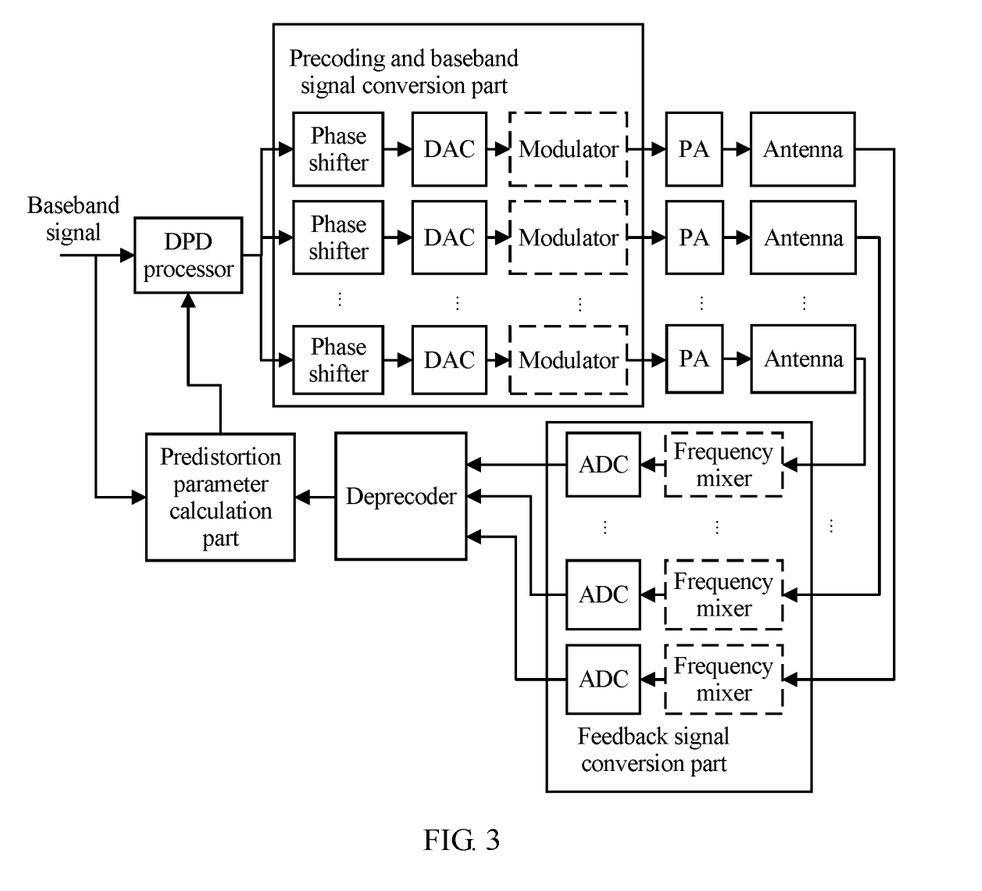
FIG. 3 is a schematic structural diagram of another digital predistortion processing apparatus according to an embodiment of this application.

FIG. 3 is a schematic structural diagram of another digital predistortion processing apparatus according to an embodiment of this application. A difference between the digital predistortion processing apparatus corresponding to FIG. 3 and that corresponding to FIG. 2 is that the digital predistortion processing apparatus couples a to-be-transmitted radio frequency signal from an antenna port to a feedback link for processing. Optionally, the digital predistortion processing apparatus may further include a coupler, configured to couple the radio frequency signal from the antenna port to the feedback link. Optionally, the coupler may be a directional coupler or a waveguide coupler. Another structure, implementation, and signal processing manner of the digital predistortion processing apparatus corresponding to FIG. 3 are the same as those of the digital predistortion processing apparatus in the embodiment corresponding to FIG. 2. Details are not described again.

FIG. 4 is a schematic structural diagram of still another digital predistortion processing apparatus according to an embodiment of this application. A difference from FIG. 2 is that the digital predistortion processing apparatus in the embodiment corresponding to FIG. 4 further includes a predistortion calibration signal sending part. The predistortion calibration signal sending part is configured to send a baseband signal dedicatedly used for DPD processing. Optionally, the dedicated baseband signal may be an OFDM signal, or may be another type of baseband signal. Optionally, the baseband signal may be periodic, to be specific, a signal that is repeated at a particular interval in a period of time.

In an example, to complete DPD processing, the predistortion calibration signal sending part sends a same signal N times, and a DPD processor, a precoding and baseband signal conversion part, and PAs perform same processing on the N same baseband signals N times. A feedback signal conversion part couples N channels of amplified radio frequency signals to a feedback link each time, and selects one channel of amplified radio frequency signal for conversion and for sending to a deprecoder. After performing processing N times, the feedback signal conversion part couples all the N channels of signals amplified by the PAs to the feedback link, converts N channels of signals into baseband signals, and sends the baseband signals to the deprecoder. The deprecoder deprecodes the N channels of baseband signals by using a precoding matrix the same as that used by the precoding and baseband signal conversion part, to obtain one channel of baseband signal, and sends the channel of baseband signal to a predistortion parameter calculation part. The predistortion parameter calculation part calculates a predistortion parameter based on the baseband signal sent by the deprecoder and a baseband signal that is sent by the predistortion calibration signal sending part and that undergoes no DPD processing, and sends the predistortion parameter to the DPD processor for updating.

Optionally, when the feedback signal conversion part includes a multichannel selector and at least two radio frequency signal converters, the feedback signal conversion part may select at least two channels of radio frequency signals for conversion each time, and complete conversion of the N channels of radio frequency signals by performing conversion M (M<N) times. Correspondingly, the predistortion calibration signal sending part needs to send a same signal M times, to complete DPD processing.

In another example, the predistortion calibration signal sending part may alternatively send a non-periodic baseband signal. In this case, the feedback signal conversion part may use an implementation shown in FIG. 2.

Another structure, implementation, and signal processing manner shown in FIG. 4 are the same as those in the embodiment corresponding to FIG. 2. Details are not described again.

Figure 5:
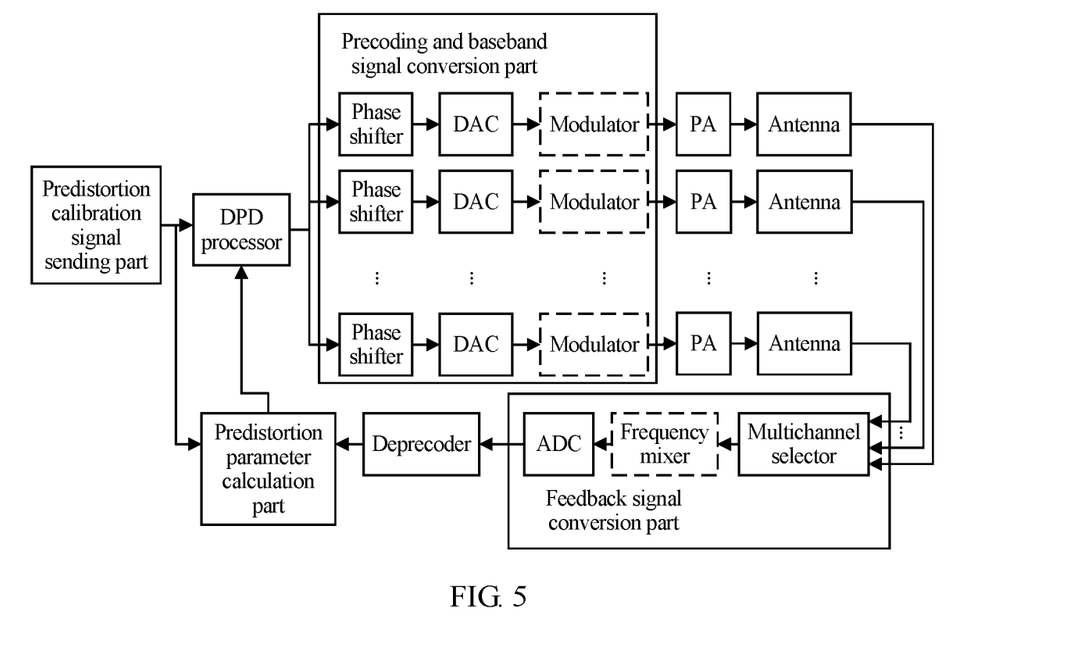
FIG. 5 is a schematic structural diagram of yet another digital predistortion processing apparatus according to an embodiment of this application.

FIG. 5 is a schematic structural diagram of yet another digital predistortion processing apparatus according to an embodiment of this application. A difference between the embodiment corresponding to FIG. 5 and that corresponding to FIG. 4 is that the digital predistortion processing apparatus couples a to-be-transmitted radio frequency signal from an antenna port to a feedback link for processing. A specific coupling manner is the same as that in the embodiment corresponding to FIG. 3. Another structure, implementation, and signal processing manner shown in FIG. 5 are the same as those in the embodiment corresponding to FIG. 4. Details are not described again.

It should be noted that the digital predistortion processing apparatus shown in each of FIG. 2 to FIG. 8 or a composition part included in the digital predistortion processing apparatus merely includes a key composition part for implementing the embodiments of this application. Another software/hardware processing module may be further disposed between the parts and/or components based on a system requirement. For example, a duplexer may be further disposed between a PA and an antenna, and a filter may be further disposed between a frequency mixer and an ADC.

The digital predistortion processing apparatus shown in each of FIG. 2 to FIG. 8 or a composition part included in the digital predistortion processing apparatus may be a circuit. The circuit may be implemented by a chip system. The chip system may include a central processing unit (CPU), a general purpose processor, a digital signal processor (DSP), an application-specific integrated circuit (ASIC), a field programmable gate array (FPGA) or another programmable logic device, a transistor logic device, a discrete device, a hardware component, or any combination of the foregoing devices. The chip system may implement or execute various example logical blocks, modules, and circuits described with reference to content disclosed in this application. The apparatus may alternatively be a combination for implementing a calculation function, for example, a combination including one or more microprocessors, or a combination of a DSP and a microprocessor. In a specific example, the digital predistortion processing apparatus provided in the embodiments of this application may be jointly implemented by a digital chip and an analog radio frequency chip in an RRU. The digital chip is configured to implement a digital signal processing component in the foregoing embodiments. The analog radio frequency chip is configured to implement a component for processing an analog signal and/or a radio frequency signal in the foregoing embodiments. Optionally, the analog radio frequency chip may further include an intermediate frequency signal processing chip and a radio frequency signal processing chip.

Figure 9:
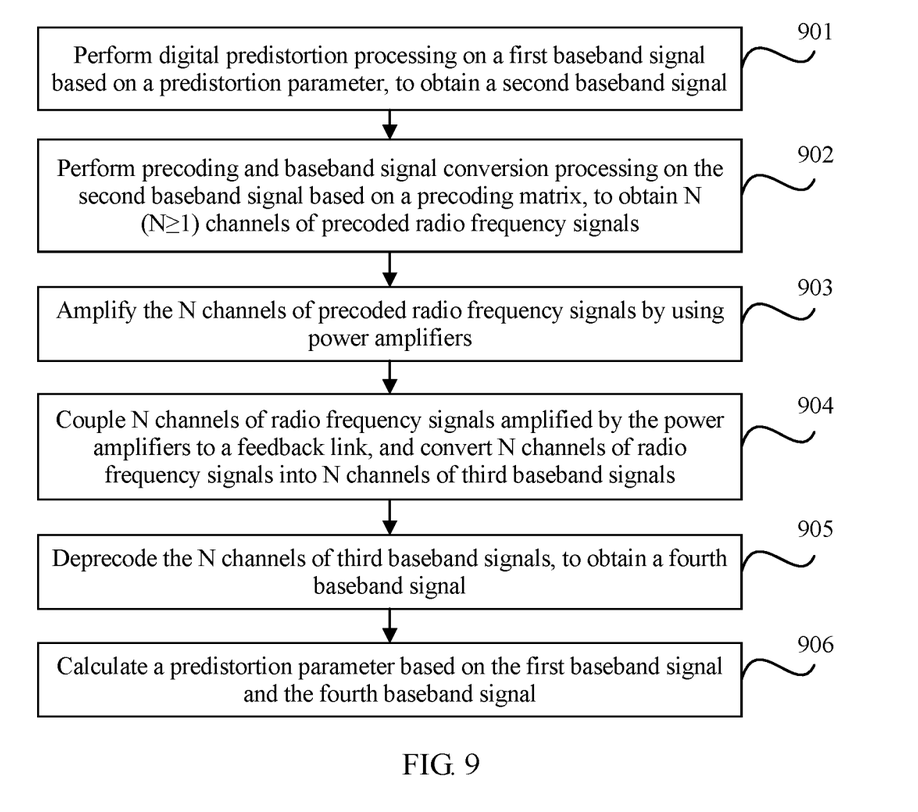
FIG. 9 is a flowchart of a digital predistortion processing method according to an embodiment of this application.

FIG. 9 is a flowchart of a digital predistortion processing method according to an embodiment of this application.

Step 901: Perform digital predistortion processing on a first baseband signal based on a predistortion parameter, to obtain a second baseband signal.

In an example, the first baseband signal may be a service signal. In a specific example, the first baseband signal may be a baseband signal sent by a BBU to an RRU. The baseband signal carries specific service data, and for example, may be an orthogonal frequency division multiplexing (orthogonal frequency division multiplexing, OFDM) signal that carries user downlink data.

In another example, the first baseband signal may be a baseband signal dedicatedly used for digital predistortion processing. The dedicated baseband signal may be sent from a BBU, and an RRU is indicated that the signal is the baseband signal dedicatedly used for the digital predistortion processing. Alternatively, the dedicated baseband signal may be generated or stored by an RRU, and sent based on a requirement or an instruction of a BBU. For example, the first baseband signal may be an OFDM signal. Optionally, the baseband signal dedicatedly used for the digital predistortion processing may be sent in a service idle time segment. The predistortion parameter obtained through calculation by using the dedicated signal may also be applied to a process of performing digital predistortion processing on a service signal. For example, in a service idle time segment, the predistortion parameter obtained through calculation by using the dedicated baseband signal may be used for digital predistortion processing on a service signal in a subsequent service signal sending process.

Optionally, the first baseband signal may be periodic, so that a digital predistortion processing apparatus completes radio frequency signal feedback of a plurality of transmit channels by processing the first baseband signal a plurality of times. For example, the periodic first baseband signal may be a periodic service signal, for example, a service signal repeatedly sent at intervals. Alternatively, the periodic first baseband signal may be a periodic baseband signal that is generated based on a requirement and that is dedicatedly used for the digital predistortion processing.

Step 902: Perform precoding and baseband signal conversion processing on the second baseband signal based on a precoding matrix, to obtain N (N≥1) channels of precoded radio frequency signals.

In an example, the precoding matrix may be obtained from a BBU, or may be stored in an RRU. For example, in a two-level precoding architecture, the RRU also needs to perform a precode operation on a baseband signal or a radio frequency signal. A specific precoding matrix is determined by the BBU and then sent to the RRU.

In an example, when the first baseband signal is a periodic signal, the same first baseband signal may be processed by using the same predistortion parameter a plurality of times, to obtain the same second baseband signal, and then precoding and baseband signal conversion processing are performed on the second baseband signal by using the same precoding matrix, so that the N channels of radio frequency signals are coupled to a feedback link in a plurality of feedback processes.

Optionally, the precoding and baseband signal conversion processing may be performed on the second baseband signal by using one of the following methods:

(1). The second baseband signal is first precoded based on the precoding matrix, to obtain N channels of precoded baseband signals, and then baseband signal conversion, for example, digital-to-analog conversion and radio frequency shift, is performed on the N channels of precoded baseband signals, to obtain the N channels of precoded radio frequency signals.

(2). The second baseband signal is first divided into N channels of signals for baseband signal conversion, to obtain N channels of same radio frequency signals, and then amplitude and/or phase adjustment are/is separately performed on the N channels of same radio frequency signals based on the precoding matrix, to obtain the N channels of precoded radio frequency signals.

(3). Baseband signal conversion is first performed on the second baseband signal, to obtain one channel of radio frequency signal, then the channel of radio frequency signal is divided into N channels of same radio frequency signals, and amplitude and/or phase adjustment are/is separately performed on the N channels of same radio frequency signals based on the precoding matrix, to obtain the N channels of precoded radio frequency signals.

(4) When baseband signal conversion is performed on the second baseband signal, amplitude and/or phase adjustment are/is implemented in a radio frequency shift process, to obtain the N channels of precoded radio frequency signals.

Certainly, one channel of digital baseband signal may alternatively be precoded and converted into an analog radio frequency signal by using another method or in another processing process. This is not limited in this application.

Step 903: Amplify the N channels of precoded radio frequency signals by using power amplifiers.

Step 904: Couple N channels of radio frequency signals amplified by the power amplifiers to a feedback link, and convert N channels of radio frequency signals into N channels of third baseband signals.

Optionally, all the N channels of radio frequency signals amplified by the power amplifiers may be coupled to the feedback link in one feedback process, or may be coupled to the feedback link in a plurality of feedback processes.

In an example, processing in step 901 to step 903 is performed on the same first baseband signal (to be specific, the periodic first baseband signal) M (1≤M≤N) times, N channels of same amplified radio frequency signals are obtained each time, at least one channel of amplified radio frequency signal may be selected and coupled to the feedback link each time, and all the N channels of amplified radio frequency signals are coupled to the feedback link after coupling is performed M times.

In another example, processing in step 901 to step 903 is performed on the same first baseband signal M times, N channels of same amplified radio frequency signals are obtained each time, and all the N channels of amplified radio frequency signals are coupled to the feedback link each time.

Optionally, the N channels of radio frequency signals in the feedback link may be converted into the N channels of third baseband signals by using one of the following methods:

(1). Feedback signal conversion, for example, down-conversion and digital-to-analog conversion, is separately performed on the N channels of radio frequency signals in one processing process, to obtain the N channels of third baseband signals.

(2). At least one channel of radio frequency signal is selected each time, feedback signal conversion is performed on the at least one channel of radio frequency signal to obtain at least one channel of third baseband signal, and conversion is performed M times to obtain the N channels of third baseband signals.

Step 905: Deprecode the N channels of third baseband signals by using the precoding matrix the same as that in step 902, to obtain a fourth baseband signal. Optionally, a specific implementation of deprecoding may be as follows: multiplying the N channels of third baseband signals by an inverse matrix of the precoding matrix, to obtain the fourth baseband signal. A specific implementation of deprecoding is not limited in this application.

Step 906: Calculate a predistortion parameter based on the first baseband signal and the fourth baseband signal.

Optionally, the predistortion parameter may be calculated by using algorithms such as a memory polynomial model and a Volterra series model. This is not limited in this application.

Optionally, the predistortion parameter may be updated by using a predistortion parameter obtained through calculation, so that the new predistortion parameter is used for next digital predistortion processing.

Optionally, step 901 to step 906 may be performed by the digital predistortion processing apparatus, for example, the digital predistortion processing apparatus shown in each of FIG. 2 to FIG. 5, or may be performed by another apparatus in a system or in a network device, for example, a digital processing apparatus in an RRU and/or an intermediate-frequency processing apparatus and a radio-frequency processing apparatus in an RRU.

The method and the apparatus described in content disclosed in this application may be implemented by using hardware, or may be implemented by a processor by executing a software instruction. The software instruction may include a corresponding software module. The software module may be stored in a RAM memory, a flash memory, a ROM memory, an EPROM memory, an EEPROM memory, a register, a hard disk, a removable hard disk, a CD-ROM, or a storage medium of any other form that is known in the art. For example, a storage medium is coupled to a processor, so that the processor can read information from the storage medium or write information into the storage medium. Certainly, the storage medium may be a component of the processor. Optionally, the processor and the storage medium may be located in an ASIC. Optionally, the ASIC may be located in a BBU and/or an RRU. Optionally, the processor and the storage medium may exist in a BBU and/or an RRU as a discrete assembly.

A person skilled in the art should be aware that in the foregoing one or more examples, functions described in this application may be implemented by hardware, software, firmware, or any combination thereof. When this application is implemented by software, the foregoing functions may be stored in a computer readable medium or transmitted as one or more instructions or code in the computer readable medium. The computer readable medium includes a computer storage medium and a communications medium. The communications medium includes any medium that enables a computer program to be transmitted from one place to another place. The storage medium may be any available medium accessible to a general-purpose or dedicated computer.

The objectives, technical solutions, and benefits of this application are further described in detail in the foregoing specific implementations. It should be understood that the foregoing descriptions are merely specific implementations of this application, but are not intended to limit the protection scope of this application. Any modification, equivalent replacement, or improvement made based on the technical solutions of this application shall fall within the protection scope of this application.

What is claimed is:

1. A digital predistortion processing apparatus, comprising a digital predistortion processor, a precoding and baseband signal conversion part, a feedback signal conversion part, a deprecoder, and a predistortion parameter calculation part, wherein the digital predistortion processor is configured to: receive a first baseband signal, perform digital predistortion processing on the first baseband signal based on a predistortion parameter to obtain a second baseband signal, and send the second baseband signal to the precoding and baseband signal conversion part;

the precoding and baseband signal conversion part is configured to: perform precoding and baseband signal conversion on the second baseband signal to obtain N channels of precoded radio frequency signals, and send the N channels of precoded radio frequency signals to power amplifiers, wherein $N \geq 1$;

the feedback signal conversion part is configured to: couple the N channels of radio frequency signals amplified by the power amplifiers to a feedback link, convert the N channels of radio frequency signals in the feedback link into N channels of third baseband signals, and send the N channels of third baseband signals to the deprecoder;

the deprecoder is configured to: deprecode the N channels of third baseband signals to obtain a fourth baseband signal, and send the fourth baseband signal to the predistortion parameter calculation part; and the predistortion parameter calculation part is configured to: calculate the predistortion parameter based on the first baseband signal and the fourth baseband signal, and send the predistortion parameter obtained through calculation to the digital predistortion processor.

2. The apparatus according to claim 1, wherein that the feedback signal conversion part couples the N channels of radio frequency signals amplified by the power amplifiers to the feedback link comprises:

coupling, to the feedback link, the N channels of radio frequency signals output by the power amplifiers; or coupling, to the feedback link, the N channels of radio frequency signals to be transmitted by antennas.

3. The apparatus according to claim 1, further comprising a predistortion calibration signal sending part, configured to send the first baseband signal to the digital predistortion processor.

4. The apparatus according to claim 1, wherein the feedback signal conversion part comprises a radio frequency signal converter.

5. The apparatus according to claim 4, wherein the feedback signal conversion part further comprises a multi-channel selector, configured to: select at least one channel of radio frequency signal from the N channels of radio frequency signals in the feedback link, and send the at least one channel of radio frequency signal to the radio frequency signal converter.

6. The apparatus according to claim 1, wherein the precoding and baseband signal conversion part comprises a phase shifter and a baseband signal converter;
the phase shifter is configured to: perform amplitude and/or phase adjustment on the second baseband signal based on a precoding matrix to obtain a precoded baseband signal, and send the precoded baseband signal to the baseband signal converter; and
the baseband signal converter is configured to convert the obtained precoded baseband signal into the precoded radio frequency signal.

7. The apparatus according to claim 1, wherein the precoding and baseband signal conversion part comprises a baseband signal converter and a phase shifter;
the baseband signal converter is configured to convert the obtained second baseband signal into a radio frequency signal; and
the phase shifter is configured to perform amplitude and/or phase adjustment on the radio frequency signal based on a precoding matrix, to obtain the precoded radio frequency signal.

8. The apparatus according to claim 1, wherein the precoding and baseband signal conversion part comprises a baseband signal converter, a power splitter, and a phase shifter;
the baseband signal converter is configured to convert the second baseband signal into one channel of radio frequency signal;
the power splitter is configured to: divide the channel of radio frequency signal into N channels of radio frequency signals, and send the N channels of radio frequency signals to the phase shifter; and
the phase shifter is configured to perform amplitude and/or phase adjustment on the radio frequency signals based on a precoding matrix, to obtain the precoded radio frequency signals.

9. The apparatus according to claim 1, further comprising a power amplifier, configured to: receive the precoded radio frequency signal, amplify the precoded radio frequency signal, and send an amplified precoded radio frequency signal to an antenna.

10. A wireless transceiver apparatus, comprising the digital predistortion processing apparatus according to claim 1 and an antenna.

11. A digital predistortion processing method, comprising:
performing digital predistortion processing on a first baseband signal based on a predistortion parameter, to obtain a second baseband signal;
performing precoding and baseband signal conversion processing on the second baseband signal based on a precoding matrix, to obtain N channels of precoded radio frequency signals, wherein $N \geq 1$;
amplifying the N channels of precoded radio frequency signals by using power amplifiers;
coupling the N channels of radio frequency signals amplified by the power amplifiers to a feedback link, and converting the N channels of radio frequency signals into N channels of third baseband signals;
deprecoding the N channels of third baseband signals, to obtain a fourth baseband signal; and
calculating the predistortion parameter based on the first baseband signal and the fourth baseband signal.

12. The method according to claim 11, wherein coupling the N channels of radio frequency signals amplified by the power amplifiers to a feedback link comprises:
coupling, to the feedback link, the N channels of radio frequency signals output by the power amplifiers; or
coupling, to the feedback link, the N channels of radio frequency signals to be transmitted by antennas.

13. The method according to claim 11, wherein the first baseband signal is a periodic signal.

14. The method according to claim 11, wherein coupling the N channels of radio frequency signals amplified by the power amplifiers to a feedback link and converting the N channels of radio frequency signals into N channels of third baseband signals comprise:
coupling, by performing radio frequency signal coupling M times and feedback signal conversion M times, the N channels of radio frequency signals amplified by the power amplifiers to the feedback link, and converting the N channels of radio frequency signals into the N channels of third baseband signals, wherein $1 \leq M \leq N$.

15. The method according to claim 11, wherein the performing precoding and baseband signal conversion processing on the second baseband signal based on a precoding matrix comprises:
performing amplitude and/or phase adjustment on the second baseband signal, to obtain N channels of precoded baseband signals; and
converting the N channels of precoded baseband signals into the N channels of precoded radio frequency signals.

16. The method according to claim 11, wherein the performing precoding and baseband signal conversion processing on the second baseband signal based on a precoding matrix comprises:
converting the second baseband signal into N channels of radio frequency signals; and
performing amplitude and/or phase adjustment on the N channels of radio frequency signals based on the precoding matrix, to obtain the N channels of precoded radio frequency signals.

* * * * *